US008240545B1

(12) United States Patent
Wang et al.

(10) Patent No.: US 8,240,545 B1
(45) Date of Patent: Aug. 14, 2012

(54) METHODS FOR MINIMIZING COMPONENT SHIFT DURING SOLDERING

(75) Inventors: Lei Wang, Fremont, CA (US); Jih-Chiou Hser, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/208,248

(22) Filed: Aug. 11, 2011

(51) Int. Cl.
*B23K 31/02* (2006.01)

(52) U.S. Cl. ......... 228/123.1; 228/56.3; 228/180.22; 228/124.1; 228/180.21; 438/106; 438/119; 438/612; 438/613; 438/616

(58) Field of Classification Search ......... 228/123.1, 228/56.3, 180.22, 124.1, 180.21; 438/106, 438/119, 612, 613, 614, 615, 616
See application file for complete search history.

(56) References Cited

U.S. PATENT DOCUMENTS

| | | | |
|---|---|---|---|
| 4,836,435 A | 6/1989 | Napp et al. | |
| 5,197,654 A | 3/1993 | Katz et al. | |
| 5,208,186 A | 5/1993 | Mathew | |
| 6,250,541 B1 * | 6/2001 | Shangguan et al. | 228/208 |
| 6,391,770 B2 | 5/2002 | Kosaki et al. | |
| 6,583,019 B2 | 6/2003 | Vandermeulen et al. | |
| 6,740,822 B2 | 5/2004 | Watanabe | |
| 6,930,389 B2 * | 8/2005 | Huang | 257/737 |
| 7,368,666 B2 | 5/2008 | Takeda | |
| 7,462,861 B2 | 12/2008 | Slater, Jr. et al. | |
| 2004/0029304 A1 | 2/2004 | Naydenkov et al. | |
| 2007/0273025 A1 | 11/2007 | Bellaiche | |
| 2009/0091024 A1 | 4/2009 | Zeng et al. | |

* cited by examiner

*Primary Examiner* — Kiley Stoner
*Assistant Examiner* — Erin Saad

(57) ABSTRACT

Methods for minimizing component shift during soldering are described. One such method includes forming a pedestal pad having a preselected shape on a substrate, forming at least one intervening layer on the substrate, the at least one intervening layer including a layer including a solidifying accelerant, and a layer including a solder, the solder layer having a preselected shape about the same as the preselected shape of the pedestal pad, positioning the component on the at least one intervening layer, and heating the solder to a predetermined process temperature, wherein the pedestal pad is configured to remain a solid during the heating the solder to the predetermined process temperature, and wherein the solidifying accelerant is configured to accelerate a solidification of the solder after the heating the solder to the predetermined process temperature.

30 Claims, 5 Drawing Sheets

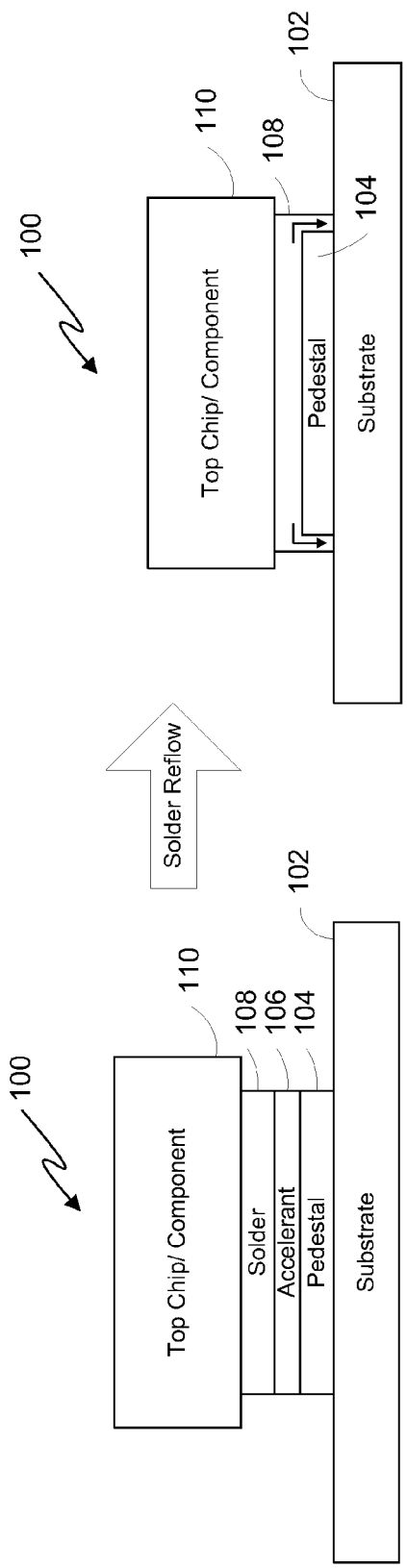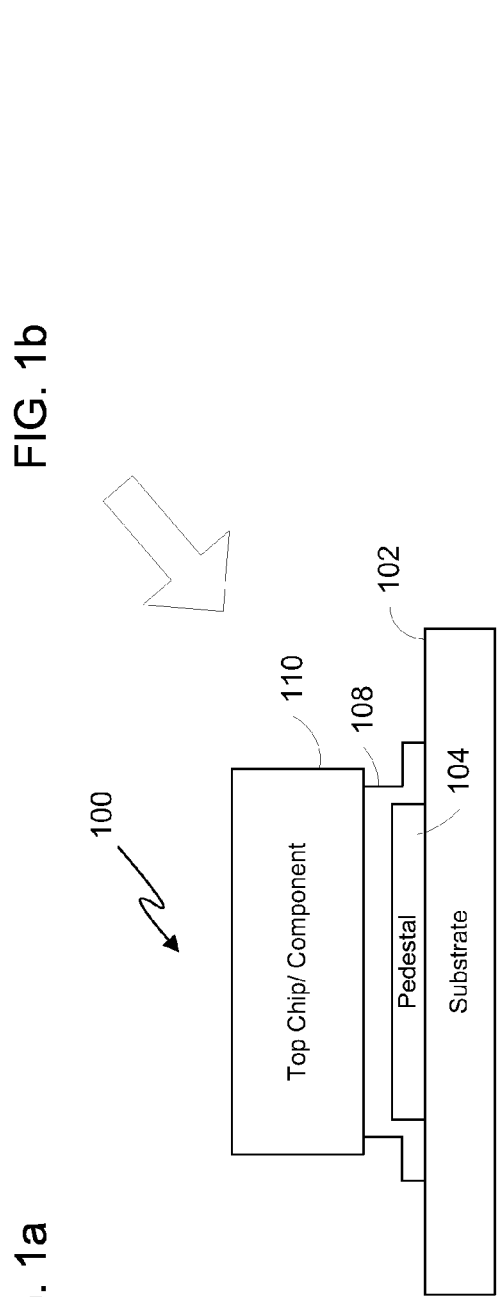

METHODS FOR MINIMIZING COMPONENT SHIFT DURING SOLDERING

FIELD

The present invention relates to component soldering, and more specifically to methods for minimizing component shift during soldering.

BACKGROUND

Traditional soldering processes place a solder pad sandwiched between components to be bonded. During solder reflow the solder melts and spreads out. The surface tension of the melted solder exerts lateral pulling forces on the top component or chip. In most cases the forces are not balanced, and as a result the top component is shifted away from its original aligned position.

As a result of this component shifting during soldering, attaching a laser diode to a slider with sub-micrometer accuracy is a challenging process. The state-of-art chip bonders can achieve the pre-bonding alignment accuracy required, but the post bond alignment usually deteriorates due to the skidding of the parts caused by reflowing of the solder sandwiched between the parts. As such, the best bonding processes for high alignment accuracy are typically those which do not involve a liquid phase of the bonder. However, due to process temperature constraints and requirements for thermal and electrical conduction, non-liquid phase solder is not very feasible and low temperature solder is therefore currently the preferred choice for attaching a laser to a slider in an energy assisted magnetic recording (EAMR) type application. Therefore, an improved solder pad design and corresponding soldering process need to be developed to ensure the post bond alignment accuracy.

SUMMARY

Aspects of the invention relate to methods for minimizing component shift during soldering. In one embodiment, the invention relates to a method for minimizing shift of a component during soldering, the method including forming a pedestal pad having a preselected shape on a substrate, forming at least one intervening layer on the substrate, the at least one intervening layer including a layer including a solidifying accelerant, and a layer including a solder, the solder layer having a preselected shape about the same as the preselected shape of the pedestal pad, positioning the component on the at least one intervening layer, and heating the solder to a predetermined process temperature, wherein the pedestal pad is configured to remain a solid during the heating the solder to the predetermined process temperature, and wherein the solidifying accelerant is configured to accelerate a solidification of the solder after the heating the solder to the predetermined process temperature.

In another embodiment, the invention relates to a method for minimizing shift of a component during soldering, the method including forming a pedestal pad having a preselected shape on a substrate, forming at least one intervening layer on the substrate, the at least one intervening layer including a layer including a solidifying accelerant, a layer including a solder, the solder layer having a preselected shape about the same as the preselected shape of the pedestal pad, and a barrier layer positioned between the solder layer and the solidifying accelerant layer, positioning the component on the at least one intervening layer, and heating the solder to a predetermined process temperature, wherein the pedestal pad is configured to remain a solid during the heating the solder to the predetermined process temperature, and wherein the solidifying accelerant is configured to accelerate a solidification of the solder after the heating the solder to the predetermined process temperature.

BRIEF DESCRIPTION OF THE DRAWINGS

FIGS. 1a to 1c are side views of a solder pad assembly, for minimizing component shift during soldering, in a first stacked configuration including a substrate, a pedestal pad, an accelerant layer, a solder layer, and the component for soldering, where the pedestal pad remains substantially solid and the accelerant speeds up solder solidification during solder reflow in accordance with one embodiment of the invention.

DETAILED DESCRIPTION

Figure 2:
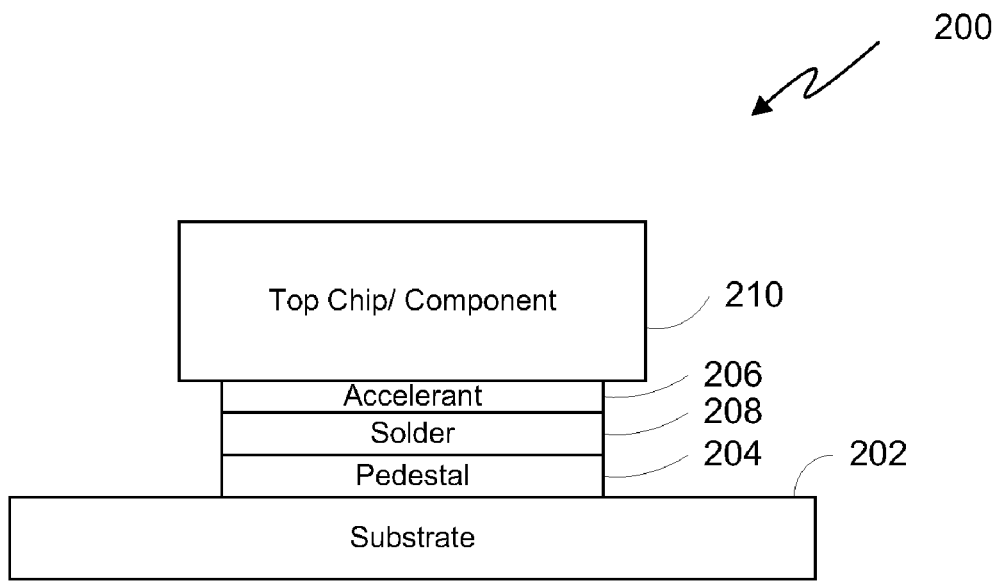
FIG. 2 is a side view of a solder pad assembly in a second stacked configuration including a substrate, a pedestal pad, a solder layer, an accelerant layer, and the component for soldering, where the pedestal pad remains substantially solid and the accelerant speeds up solder solidification during solder reflow in accordance with one embodiment of the invention.

Referring now to the drawings, methods for minimizing component shift in a solder pad assembly during soldering are illustrated. The methods include forming a pedestal pad having a preselected shape on a base substrate that is to be soldered to a component, where the pedestal pad is configured to remain substantially solid during solder reflow. The methods further include forming a solidifying accelerant layer and a solder layer on the pedestal pad in various configurations, and positioning the component on those layers. The solder pad assembly is heated to a preselected process temperature, but the pedestal pad and accelerant substantially inhibit component shift (e.g., lateral forces). Instead, the top component of the solder pad assembly may experience some vertical forces. The solidifying accelerant is configured to accelerate solder solidification after solder reflow/heating. The solder layer has a preselected shape that is about the same as the preselected shape of the pedestal pad, which helps to avoid lateral forces on the component during the solder reflow.

In another embodiment, the method includes adding one or more barrier layers between the solder layer and the accelerant layer so that an alignment heating process can be performed prior to the solder reflow at a lower temperature without prematurely causing diffusion of the accelerant into the solder. In accordance with this method, a number of different configurations of the solder layers, the accelerant layers and the barrier layers are possible. In several embodiments, the methods described herein can be used for attaching a slider for a magnetic storage device to a laser sub-mount assembly for directing light on a magnetic media of the magnetic storage device.

FIGS. 1a to 1c are side views of a solder pad assembly 100, for minimizing component shift during soldering, in a first stacked configuration including a substrate 102 at the bottom, a pedestal pad 104, an accelerant layer 106, a solder layer 108, and the component 110 for soldering at the top, where the pedestal pad 104 remains substantially solid and the accelerant 106 speeds up solder solidification during solder reflow in accordance with one embodiment of the invention. FIG. 1a illustrates the solder pad assembly 100 prior to solder reflow in accordance with one embodiment of the invention. A base substrate 102 (e.g., solder pad) is to be soldered to the component 100 (e.g., top chip). To minimize component shift during soldering, a pedestal pad 104 having a preselected shape is placed on the substrate 102. The pedestal pad 104 is configured to remain substantially solid during solder reflow. To speed up solidification of the solder 108 during reflow, the accelerant layer 106 is positioned on the pedestal 104. The solder layer (e.g., solder pad) 108 is then placed on the accelerant layer 106. To further minimize component shift during soldering, the solder layer 108 is deposited and/or formed to have a shape that is substantially the same as the preselected shape of the pedestal pad 104. In several embodiments, the solder layer shape is the same as the pedestal pad shape in a plane (e.g., XY plane) that extends parallel to a top surface of the component 110 in FIG. 1a. In one embodiment, the solder layer and pedestal pad shapes are the same in the XY plane while the thickness of the shapes may vary. In a final assembly step, the component 110 to be coupled by soldering is placed on the solder layer 108.

In one embodiment, the base substrate 102 is made of one or more conductive materials known in the art that are commonly found in solder pads. In one embodiment, the pedestal pad 104 includes a base adhesion layer such as Ti, a barrier layer such as Pt on the base layer, and a protective layer such as Au. If the solder layer 108 is made of a Sn/Au alloy, then the solidifying accelerant 106 can be Ni, which would be placed on the Au of the pedestal pad 104. If the accelerant is Ni, just a small amount of the Ni can substantially raise the solder melting point. In addition, a Ni accelerant can diffuse very quickly into several common solder alloys. In another embodiment, Cu can be used as an accelerant with a solder alloy consisting of SnPb. In such case, just a small portion of the Cu accelerant can quickly raise the melting point of the SnPb solder.

In one embodiment, the pedestal pad 104 includes a Ti base adhesion layer having a thickness of about 50 nanometers (nm), a Pt barrier layer having a thickness of about 200 nm, and a Au protective layer having a thickness of about 1.8 microns. In such case, the accelerant layer 106 can be Ni with a thickness of about 200 nm, and the solder layer 108 can be a Sn/Au alloy with a thickness of about 3 microns for the Sn and about 150 nm for the Au.

In other embodiments, the pedestal pad, solder, and accelerant can be made of other suitable materials. For example, in several embodiments, the pedestal pad can be made of one or more metallic materials selected from Ti, Pt, Au, Ni, Cu, and Al. In one embodiment, the solder is a low temperature solder such as AgSn, SnAu, or another suitable low temperature solder. In other embodiments, other suitable solder alloys can be used, including, for example, Sn or CuSn.

In several embodiments, the preselected shape of the pedestal pad 104 is a rectangular block shape or a cylinder shape having a central axis perpendicular to the substrate 102. In other embodiments, the preselected shape of the pedestal pad 104, and correspondingly that of the solder layer 108, can have another shape suitable for maintaining a solder attachment between the substrate and component. For example, in one embodiment, the preselected shape of the pedestal pad 104 is a bowtie shaped block where a horizontal cross section of the block has a bowtie shape that resembles a modified rectangle where a central region thereof is tapered inward to be narrower in width at the central region than the end regions of the bowtie shape. The bowtie shape can also be thought of as a dumbbell or butterfly bandage type shape. This bowtie shape can be useful for inhibiting a concentration of solder in the central region of the pedestal pad during reflow. After reflow, the melted solder on the bowtie shaped pedestal pad can substantially form a rectangular shape as the solder expands to the tapered areas of the bowtie shaped pedestal pad.

In several embodiments, the pedestal pad 104 has a side height, or thickness, of about ⅒ to 2 times a side height or thickness of the solder layer 108. In one such embodiment, the pedestal pad 104 has a side height of about ⅓ of the side height of the solder layer 108. In one embodiment, for example, the thickness of the solder layer is about 5.4 microns and the thickness of the pedestal pad is about 2 microns. In several embodiments, the solder layer 108 is positioned such that a central axis thereof is fairly well aligned with a central axis of the pedestal pad 104. This can also help to avoid any component shift during soldering.

In one embodiment, the accelerant may not be deposited in a uniform layer form. In one embodiment, the accelerant may be partially integrated with the solder prior to being heated. In other embodiments, other suitable combinations of the solder and accelerant may be used.

FIG. 1b illustrates the solder pad assembly 100 just after solder starts reflowing in accordance with one embodiment of the invention. After the reflow, the accelerant 106 has diffused into the solder 108 and sped up the solidification process for the solder 108. Some amount of the solder 108 melts and extends along the side walls of the pedestal pad 104. However, the surface tension on the component 110 caused by the solder 106 is exerted primarily only in a vertical direction, and thus lateral forces that could cause lateral shifting of the component are substantially avoided. In addition, the accelerant 106 has decreased the amount of time the solder 106 spends in a liquid phase, which also helps avoid any lateral component shift.

The arrows within the body of the solder 108 are indicative of the forces on the solder 108 and therefore also applied to the component 110 during reflow. As is illustrated, the reflow forces include some minimal and symmetric lateral forces (shown as extending horizontally outward from the pedestal pad 104) that are opposite in direction from one another and thereby effectively cancel each other out. The reflow forces also include downward or vertical forces that pull the solder 108 down toward the substrate.

FIG. 1c illustrates the solder pad assembly 100 in a final state after solder reflow in accordance with one embodiment of the invention. During the solder liquid phase, the solder 108 has extended down to the top surface of the substrate and settled outward along the top surface for a small distance. As illustrated in FIG. 1c, the solder 108 has solidified and the assembly 100 is stable with minimal or negligible lateral movement of the component 110.

In several embodiments, the diffused accelerant also raises the melting temperature of the solder. In several embodiments, the solder pad assembly 100 is heated to a preselected process temperature that is greater than the solder melting temperature. In one embodiment, the preselected process temperature ranges from about 220 degrees Celsius to about 280 degrees Celsius for a Sn/Au solder alloy. In another embodiment, the preselected process temperature ranges from about 220 degrees Celsius to about 240 degrees Celsius for a Sn/Au solder alloy. In some embodiments, the solder pad assembly 100 is heated to a preselected alignment temperature for an alignment process prior to solder reflow. In such case, the preselected alignment temperature is less than the preselected process temperature. In several embodiments, the solder melting point is dependent on the particular solder alloys used. The solder melting points of solder alloys are well known in the art.

In several embodiments, the preselected shape of the pedestal pad 104 and corresponding shape of the solder layer 108 are configured to inhibit a lateral flow of the solder, and to facilitate a vertical flow of the solder down the side walls of the pedestal pad, during reflow. In one embodiment, the substrate is a slider for a magnetic storage device and the component is a laser sub-mount assembly for directing light on a magnetic media of the magnetic storage device.

FIG. 2 is a side view of a solder pad assembly 200 in a second stacked configuration including a substrate 202 at the bottom, a pedestal pad 204, a solder layer 208, a solidifying accelerant layer 206, and the component 210 for soldering at the top, where the pedestal pad 204 remains substantially solid and the accelerant 206 speeds up solder solidification during solder reflow in accordance with one embodiment of the invention. In several embodiments, each of the components of the solder pad assembly 200 can function substantially as described above.

Figure 3:
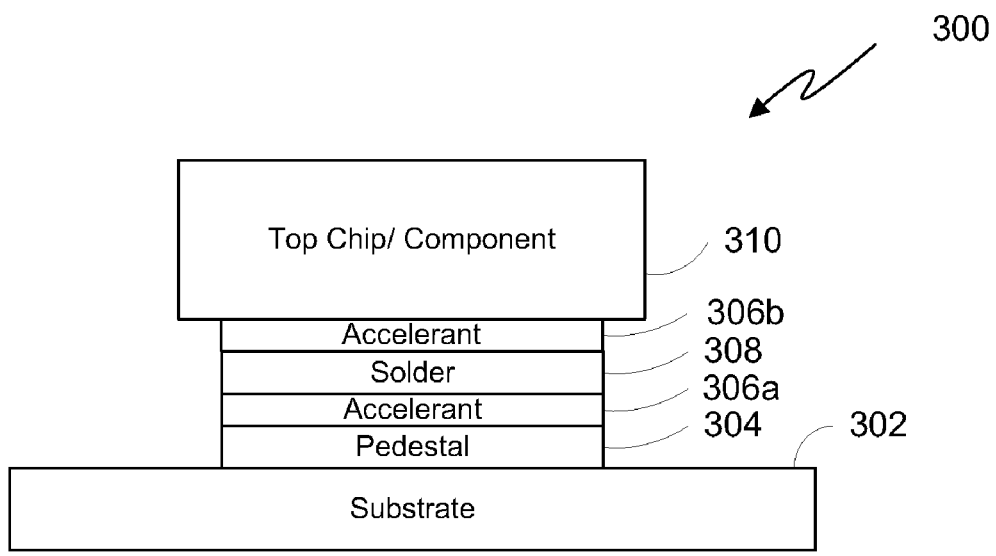
FIG. 3 is a side view of a solder pad assembly in a third stacked configuration including a substrate, a pedestal pad, a first accelerant layer, a solder layer, a second accelerant layer, and the component for soldering, where the pedestal pad remains substantially solid and the accelerant speeds up solder solidification during solder reflow in accordance with one embodiment of the invention.

FIG. 3 is a side view of a solder pad assembly 300 in a third stacked configuration including a substrate 302 at the bottom, a pedestal pad 304, a first accelerant layer 306a, a solder layer 308, a second accelerant layer 306b, and the component 310 for soldering at the top, where the pedestal pad 304 remains substantially solid and the accelerants (306a, 306b) speed up solder solidification during solder reflow in accordance with one embodiment of the invention. In several embodiments, each of the components of the solder pad assembly 300 can function substantially as described above.

Figure 4:
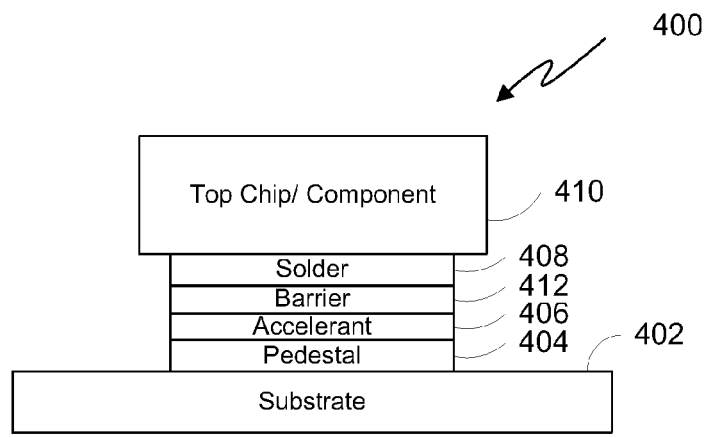
FIG. 4 is a side view of a solder pad assembly in a fourth stacked configuration including a substrate, a pedestal pad, an accelerant layer, a barrier layer, a solder layer, and the component for soldering, where the barrier layer substantially prevents the accelerant from interacting with the solder until a preselected process temperature is reached in accordance with one embodiment of the invention.

FIG. 4 is a side view of a solder pad assembly 400 in a fourth stacked configuration including a substrate 402 at the bottom, a pedestal pad 404, an accelerant layer 406, a barrier layer 412, a solder layer 408, and the component 410 for soldering at the top, where the barrier layer 412 substantially prevents the accelerant 406 from interacting with the solder 408 until a preselected process temperature is reached in accordance with one embodiment of the invention. In several embodiments, an alignment process precedes the solder reflow process. In such case, it is useful to heat the solder pad assembly to a preselected alignment temperature to avoid issues related to the coefficient of thermal expansion (CTE) for each component to be solder attached. However, without a barrier layer, the accelerant may partially or fully diffuse prematurely into the solder during the alignment heating.

To avoid this issue, the barrier layer 412 is placed between the accelerant 406 and the solder 408. In several embodiments, the barrier layer 412 is configured to prevent interaction between the accelerant 406 and the solder 408 when the assembly is heated to the preselected alignment temperature. Similarly, in several embodiments, the barrier layer 412 is configured to disintegrate, at least partially, when the assembly is heated to the preselected process temperature, which is typically greater than the preselected alignment temperature. In such case, the accelerant 406 passes through the barrier layer 412 and diffuses into the solder 408 during reflow. In one embodiment, the barrier layer is made of Pd or Pt. In other embodiments, the barrier layer can be made of other suitable materials.

Figure 5:
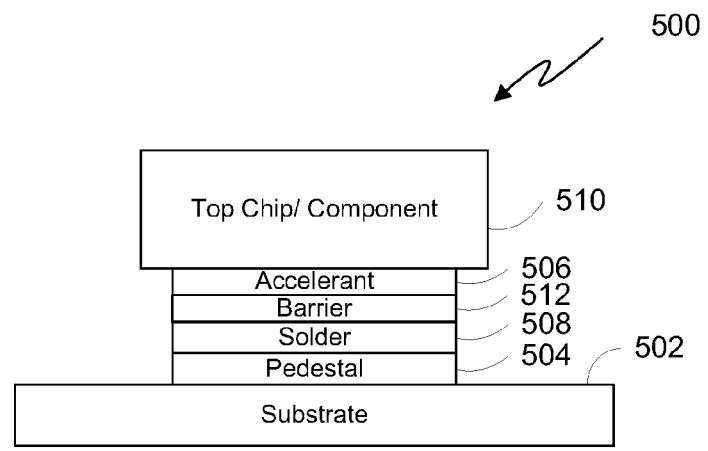
FIG. 5 is a side view of a solder pad assembly in a fifth stacked configuration including a substrate, a pedestal pad, a solder layer, a barrier layer, an accelerant layer, and the component for soldering, where the barrier layer substantially prevents the accelerant from interacting with the solder until a preselected process temperature is reached in accordance with one embodiment of the invention.

FIG. 5 is a side view of a solder pad assembly 500 in a fifth stacked configuration including a substrate 502 at the bottom, a pedestal pad 504, a solder layer 508, a barrier layer 512, an accelerant layer 506, and the component 510 for soldering at the top, where the barrier layer 512 substantially prevents the accelerant 506 from interacting with the solder 508 until a preselected process temperature is reached in accordance with one embodiment of the invention. In several embodiments, each of the components of the solder pad assembly 500 can function substantially as described above.

Figure 6:
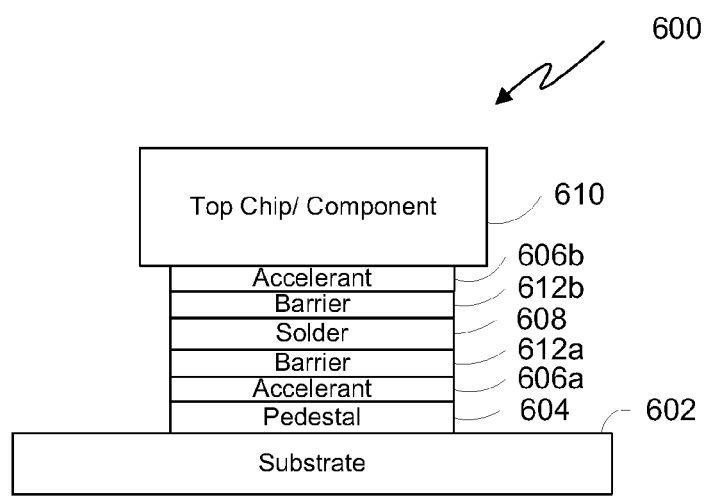
FIG. 6 is a side view of a solder pad assembly in a sixth stacked configuration including a substrate, a pedestal pad, a first accelerant layer, a first barrier layer, a solder layer, a second barrier layer, a second accelerant layer, and the component for soldering, where the barrier layers substantially prevent the accelerants from interacting with the solder until a preselected process temperature is reached in accordance with one embodiment of the invention.

FIG. 6 is a side view of a solder pad assembly 600 in a sixth stacked configuration including a substrate 602 at the bottom, a pedestal pad 604, a first accelerant layer 606a, a first barrier layer 612a, a solder layer 608, a second barrier layer 612b, a second accelerant layer 606b, and the component 610 for soldering at the top, where the barrier layers (612a, 612b) substantially prevent the accelerants (606a, 606b) from interacting with the solder 608 until a preselected process temperature is reached in accordance with one embodiment of the invention. In several embodiments, each of the components of the solder pad assembly 600 can function substantially as described above.

Figure 7:
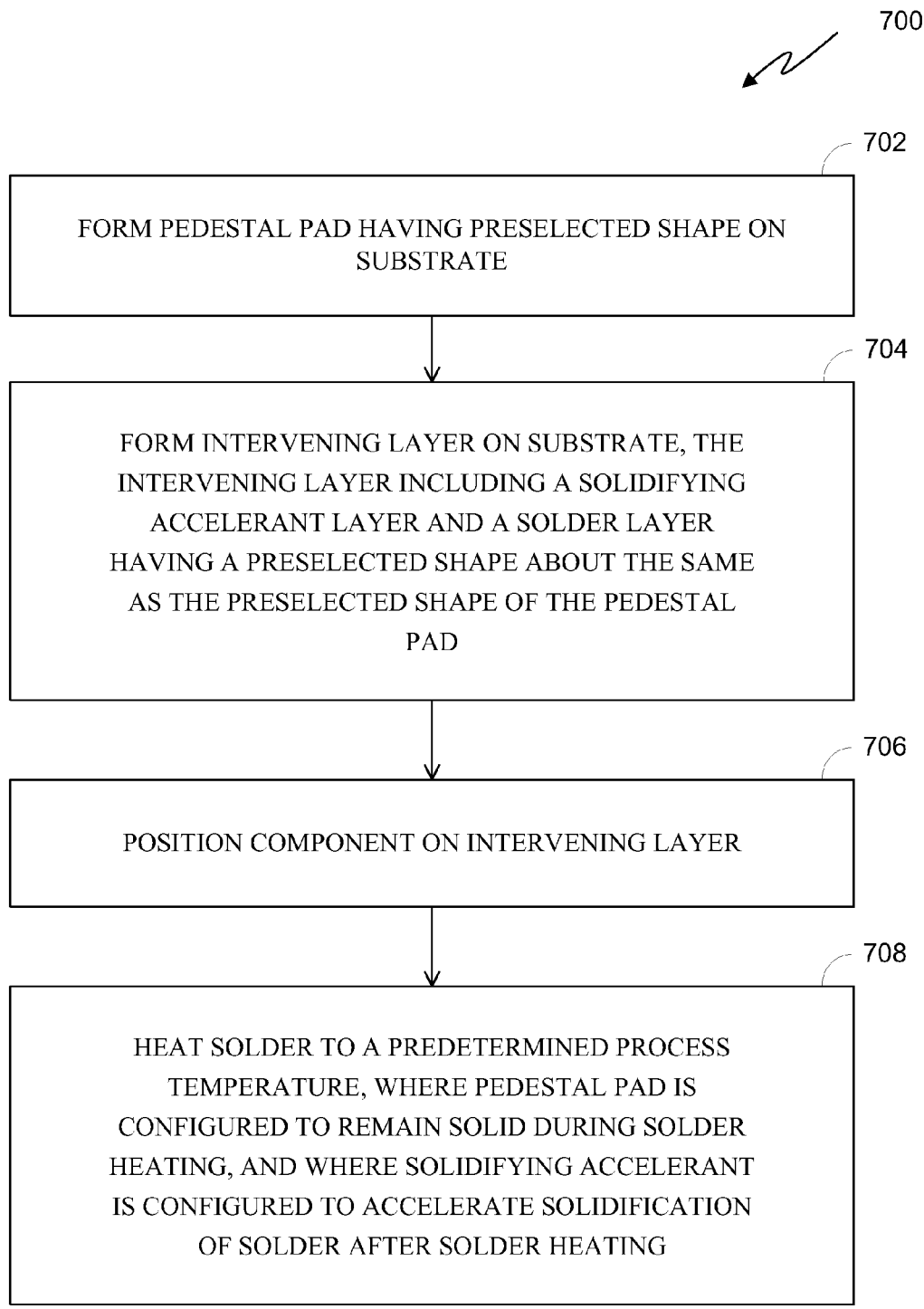
FIG. 7 is a flow chart of a process for minimizing component shift in a solder pad assembly during soldering in accordance with one embodiment of the invention.

FIG. 7 is a flow chart of a process 700 for minimizing component shift in a solder pad assembly during soldering in accordance with one embodiment of the invention. The process first forms (702) a pedestal pad having a preselected shape on a substrate. The process then forms (704) at least one intervening layer on the substrate, the at least one intervening layer including a solidifying accelerant layer and a solder layer having a preselected shape about the same as the preselected shape of the pedestal pad. The process then positions (706) the component on the at least one intervening layer.

The process heats (708) the solder to a predetermined process temperature, where the pedestal pad is configured to remain a solid during the solder heating, and the solidifying accelerant is configured to accelerate solidification of the solder after the solder heating. In several embodiments, the predetermined process temperature is greater than the solder melting point. In several embodiments, process 700 can be used in conjunction with the solder pad assemblies illustrated in FIGS. 1-3.

In one embodiment, the process can perform the sequence of actions in a different order. In another embodiment, the process can skip one or more of the actions. In other embodiments, one or more of the actions are performed simultaneously. In some embodiments, additional actions can be performed.

Figure 8:
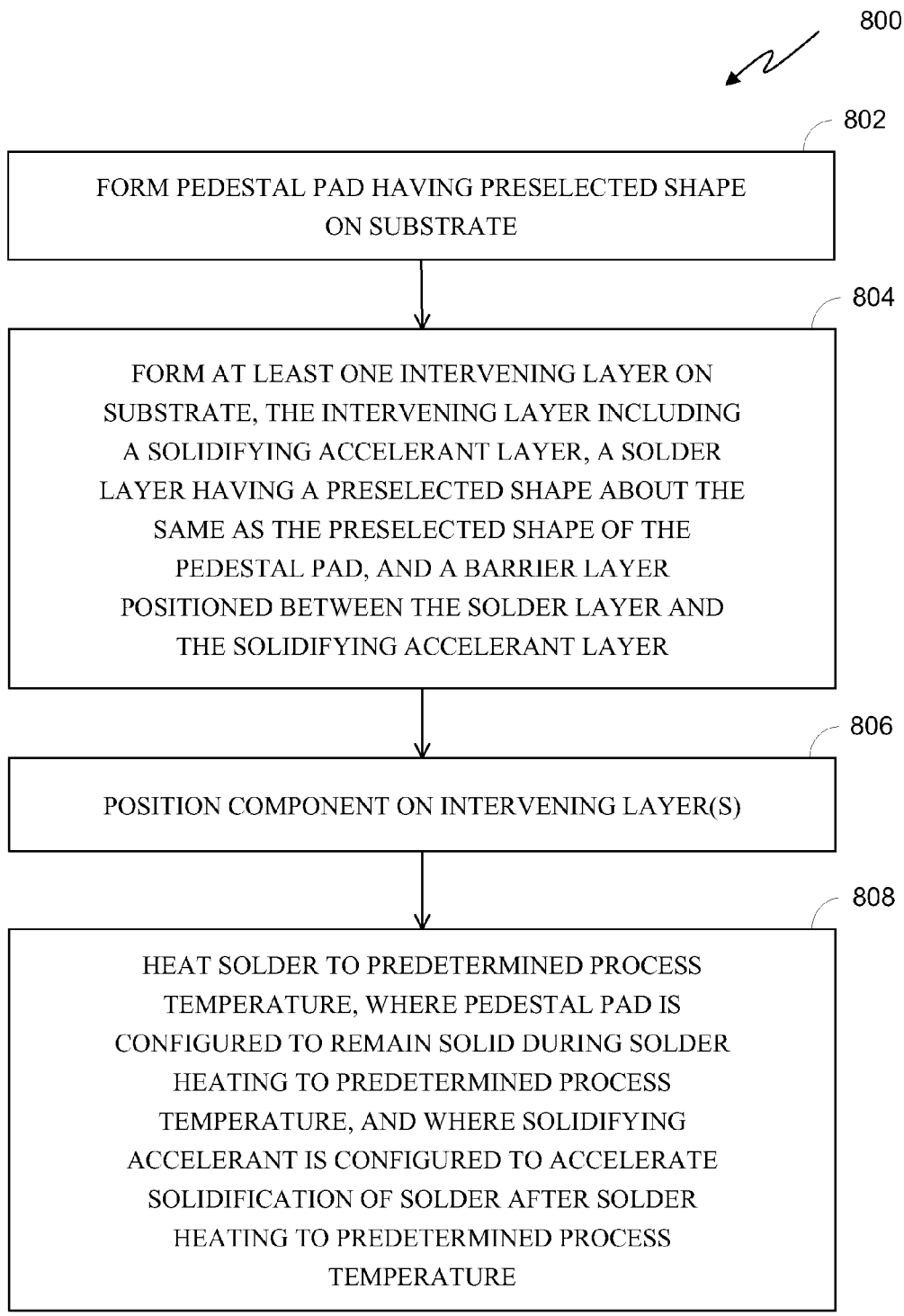
FIG. 8 is a flow chart of a process for minimizing component shift in a solder pad assembly during soldering, where the solder pad assembly includes a barrier layer for substantially preventing the accelerant from interacting with the solder until a preselected process temperature is reached in accordance with one embodiment of the invention.

FIG. 8 is a flow chart of a process 800 for minimizing component shift in a solder pad assembly during soldering, where the solder pad assembly includes a barrier layer for substantially preventing the accelerant from interacting with the solder until a preselected process temperature is reached in accordance with one embodiment of the invention. The process first forms (802) a pedestal pad having a preselected shape on a substrate. The process then forms (804) at least one intervening layer on the substrate, the intervening layer including a solidifying accelerant layer, a solder layer having a preselected shape about the same as the preselected shape of the pedestal pad, and a barrier layer positioned between the solder layer and the solidifying accelerant layer.

The process then positions (706) the component on the intervening layer(s). The process heats (708) the solder to a predetermined process temperature, where the pedestal pad is configured to remain a solid as the solder is heated to the predetermined process temperature, and the solidifying accelerant is configured to accelerate solidification of the solder after the solder is heated to the predetermined process temperature. In several embodiments, process 800 can be used in conjunction with the solder pad assemblies illustrated in FIGS. 4-6.

In one embodiment, the process can perform the sequence of actions in a different order. In another embodiment, the process can skip one or more of the actions. In other embodiments, one or more of the actions are performed simultaneously. In some embodiments, additional actions can be performed.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

For example, FIGS. 1-6 illustrate specific configurations of pedestal pads, solder layers, accelerant layers, and barrier layers. In other embodiments, other suitable configurations of these layers can be formed as well.

What is claimed is:

1. A method for minimizing shift of a component during soldering, the method comprising:
    forming a pedestal pad having a preselected shape on a substrate;
    forming at least one intervening layer on the substrate, the at least one intervening layer comprising:
        a layer comprising a solidifying accelerant, and
        a layer comprising a solder, the solder layer having a preselected shape about the same as the preselected shape of the pedestal pad;
    positioning the component on the at least one intervening layer; and
    heating the solder to a predetermined process temperature, wherein the pedestal pad is configured to remain a solid during the heating the solder to the predetermined process temperature, and
    wherein the solidifying accelerant is configured to accelerate a solidification of the solder after the heating the solder to the predetermined process temperature.

2. The method of claim 1, wherein the preselected shape of the pedestal pad comprises a shape selected from the group consisting of a rectangular block shape and a cylinder shape.

3. The method of claim 1, wherein the pedestal pad comprises a side height in a range from about $1/10$ to about 2 times a side height of the solder layer.

4. The method of claim 3, wherein the side height of the pedestal pad is about $1/3$ of the side height of the solder layer.

5. The method of claim 1, wherein the solidifying accelerant is Ni.

6. The method of claim 1, wherein the predetermined process temperature is based on a predetermined melting temperature of the solder.

7. The method of claim 6, wherein, during the heating the solder to the predetermined process temperature, the solidifying accelerant is configured to:
    diffuse into the solder; and
    form an alloy with a second predetermined melting temperature greater than the predetermined process temperature.

8. The method of claim 1, wherein the preselected shape of the pedestal pad and the corresponding preselected shape of the solder layer are configured to inhibit a lateral flow of the solder during the heating the solder to the predetermined process temperature.

9. The method of claim 1, wherein the preselected shape of the pedestal pad and the corresponding preselected shape of the solder layer are configured to facilitate a vertical flow of the solder down one or more sidewalls of the pedestal pad during the heating the solder to the predetermined process temperature.

10. The method of claim 1, wherein the forming the pedestal pad on the substrate comprises depositing one or more metallic materials on the substrate.

11. The method of claim 10, wherein the pedestal pad comprises one or more metallic materials selected from the group consisting of Ti, Pt, Au, Ni, Cu, and Al.

12. The method of claim 11, wherein the forming the pedestal pad on the substrate comprises:
    depositing a layer of Ti on the substrate;
    depositing a layer of Pt on the Ti layer;
    depositing a layer of Au on the Pt layer; and
    depositing a layer of Ni on the Au layer.

13. The method of claim 1, wherein the forming the pedestal pad on the substrate comprises depositing one or more non-metallic materials on the substrate.

14. The method of claim 1, wherein the solder comprises a low temperature solder.

15. The method of claim 1, wherein the solder comprises an alloy selected from the group consisting of Sn, AuSn, CuSn and AgSn.

16. The method of claim 1, wherein the predetermined process temperature is a temperature in a range from about 220 degrees Celsius to about 280 degrees Celsius.

17. The method of claim 1, wherein the substrate is a slider for a magnetic storage device and the component is a laser-submount assembly for directing light on a magnetic media of the magnetic storage device.

18. The method of claim 1:
    wherein the solidifying accelerant layer is on the pedestal pad, and
    wherein the solder layer is on the solidifying accelerant layer.

19. The method of claim 1:
wherein the solder layer is on the pedestal pad, and
wherein the solidifying accelerant layer is on the solder layer.

20. The method of claim 1:
wherein the at least one intervening layer comprises a second solidifying accelerant layer,
wherein the solidifying accelerant layer is on the pedestal pad,
wherein the solder layer is on the solidifying accelerant layer, and
wherein the second solidifying accelerant layer is on the solder layer.

21. The method of claim 1, further comprising depositing the solidifying accelerant layer on the component.

22. The method of claim 21:
wherein a second solidifying accelerant layer is deposited on the pedestal pad,
wherein the solder layer is on the second solidifying accelerant layer, and
wherein the solidifying accelerant layer is on the solder layer.

23. A method for minimizing shift of a component during soldering, the method comprising:
forming a pedestal pad having a preselected shape on a substrate;
forming at least one intervening layer on the substrate, the at least one intervening layer comprising:
a layer comprising a solidifying accelerant,
a layer comprising a solder, the solder layer having a preselected shape about the same as the preselected shape of the pedestal pad, and
a barrier layer positioned between the solder layer and the solidifying accelerant layer;
positioning the component on the at least one intervening layer; and
heating the solder to a predetermined process temperature,
wherein the pedestal pad is configured to remain a solid during the heating the solder to the predetermined process temperature, and
wherein the solidifying accelerant is configured to accelerate a solidification of the solder after the heating the solder to the predetermined process temperature.

24. The method of claim 23,
wherein at least a portion of the barrier layer is configured to disintegrate during the heating the solder to the predetermined process temperature, and
wherein, during the heating the solder to the predetermined process temperature, the solidifying accelerant is configured to pass through the barrier layer and diffuse into the solder.

25. The method of claim 23, wherein the predetermined process temperature is based on a predetermined melting temperature of the solder.

26. The method of claim 25, wherein, during the heating the solder to the predetermined process temperature, the solidifying accelerant is configured to:
pass through the barrier layer and diffuse into the solder; and
form an alloy with a second predetermined melting temperature greater than the predetermined process temperature.

27. The method of claim 23:
wherein the solidifying accelerant layer is on the pedestal pad,
wherein the barrier layer is on the solidifying accelerant layer, and
wherein the solder layer is on the barrier layer.

28. The method of claim 23:
wherein the solder layer is on the pedestal pad,
wherein the barrier layer is on the solder layer, and
wherein the solidifying accelerant layer is on the barrier layer.

29. The method of claim 23, wherein the barrier layer comprises a material selected from the group consisting of Pd and Pt.

30. The method of claim 23:
wherein the at least one intervening layer comprises a second barrier layer and a second layer comprising the solidifying accelerant;
wherein the solidifying accelerant layer is on the pedestal pad,
wherein the barrier layer is on the solidifying accelerant layer,
wherein the solder layer is on the barrier layer,
wherein the second barrier layer is on the solder layer, and
wherein the second solidifying accelerant layer is on second barrier layer.

* * * * *